United States Patent
Lai et al.

(10) Patent No.: US 9,506,974 B2
(45) Date of Patent: Nov. 29, 2016

(54) ACTIVE PROBE CARD

(71) Applicant: Sitronix Technology Corp., Hsinchu County (TW)

(72) Inventors: Hung-Wei Lai, Hsinchu County (TW); Tsung-Jun Lee, Hsinchu County (TW)

(73) Assignee: Sitronix Technology Corp., Hsinchu County (TW)

( * ) Notice: Subject to any disclaimer, the term of this patent is extended or adjusted under 35 U.S.C. 154(b) by 56 days.

(21) Appl. No.: 14/476,729

(22) Filed: Sep. 3, 2014

(65) Prior Publication Data

US 2015/0212112 A1 Jul. 30, 2015

Related U.S. Application Data

(60) Provisional application No. 61/930,964, filed on Jan. 24, 2014.

(30) Foreign Application Priority Data

Apr. 2, 2014 (TW) .............................. 103112352 A

(51) Int. Cl.
*G01R 31/20* (2006.01)
*G01R 31/26* (2014.01)
*G01R 1/073* (2006.01)
*G01R 1/30* (2006.01)
*G01R 31/27* (2006.01)

(52) U.S. Cl.
CPC ............ *G01R 31/2601* (2013.01); *G01R 1/073* (2013.01); *G01R 1/30* (2013.01); *G01R 31/27* (2013.01)

(58) Field of Classification Search
CPC G01R 31/2886; G01R 31/2889; G01R 1/45; G01R 1/6788
See application file for complete search history.

(56) References Cited

U.S. PATENT DOCUMENTS

| | | | | |
|---|---|---|---|---|
| 5,070,297 A | * | 12/1991 | Kwon | G01R 31/31905 324/754.03 |
| 6,232,790 B1 | * | 5/2001 | Bryan | B81C 99/005 324/754.07 |
| 6,768,328 B2 | * | 7/2004 | Self | G01R 1/07307 324/72.5 |
| 6,791,317 B1 | * | 9/2004 | Walsh | G01R 1/045 324/756.02 |
| 7,782,070 B2 | * | 8/2010 | Ku | G01R 31/2889 324/754.1 |
| 8,067,951 B2 | | 11/2011 | Miller | |
| 8,643,396 B2 | * | 2/2014 | Spinar | G01R 1/06788 324/754.03 |
| 8,952,713 B1 | * | 2/2015 | Dastidar | G01R 31/2886 324/754.01 |
| 2005/0162176 A1 | * | 7/2005 | Bucksch | G01R 31/31924 324/754.18 |
| 2010/0253377 A1 | | 10/2010 | Strid | |
| 2013/0099812 A1 | | 4/2013 | Wang | |

FOREIGN PATENT DOCUMENTS

JP S6159849 A 3/1986
JP 2002538973 A 11/2002
(Continued)

*Primary Examiner* — Minh N Tang
(74) *Attorney, Agent, or Firm* — Winston Hsu; Scott Margo

(57) ABSTRACT

An active probe card capable of improving testing bandwidth of a device under (DUT) test includes a printed circuit board; at least one probe needle, affixed to a first surface of the printed circuit board for probing the DUT; at least one connection member, electrically connected to the at least one probe needle; and an amplification circuit, formed on the printed circuit board and coupled to the at least one connection member for amplifying an input or output signal of the DUT.

6 Claims, 5 Drawing Sheets

(56) References Cited

FOREIGN PATENT DOCUMENTS

| | | |
|---|---|---|
| KR | 1020060126700 A | 12/2006 |
| KR | 1020090018714 A | 2/2009 |
| TW | 540709 | 7/2003 |
| TW | 201020560 | 6/2010 |
| TW | M486771 | 9/2014 |
| WO | 0053528 | 9/2000 |
| WO | 2009147721 A1 | 12/2009 |

* cited by examiner

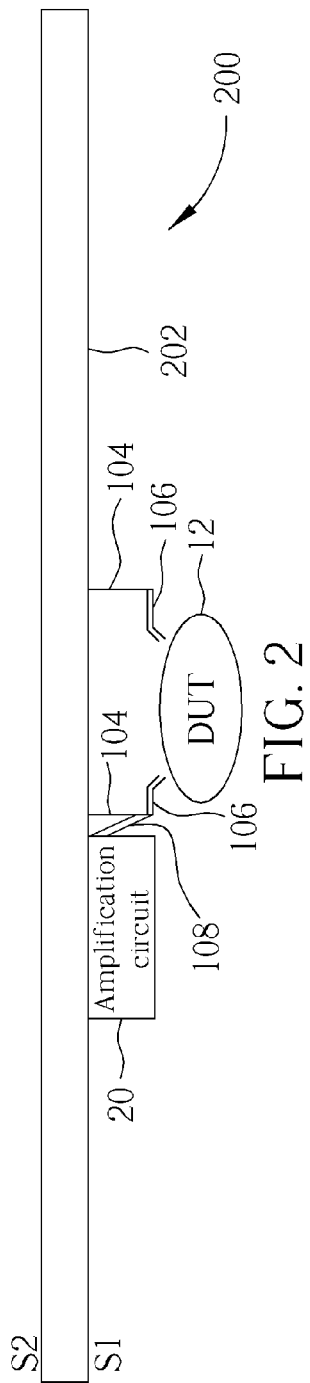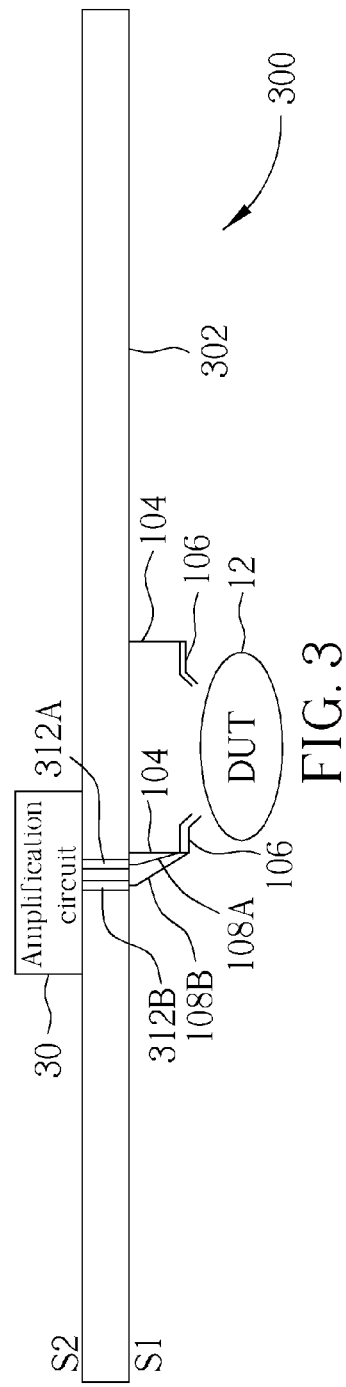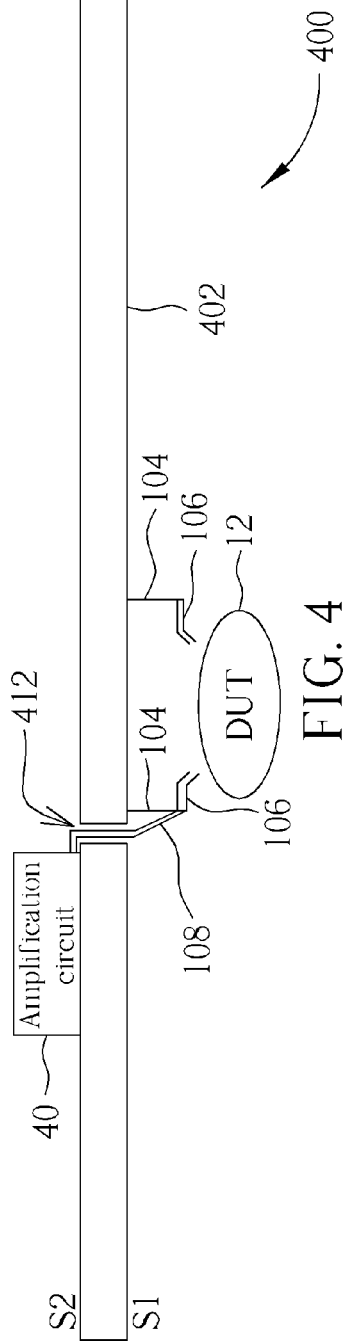

ACTIVE PROBE CARD

CROSS REFERENCE TO RELATED APPLICATIONS

This application claims the benefit of U.S. Provisional Application No. 61/930,964, filed on Jan. 24, 2014 and entitled "Active Probe", the contents of which are incorporated herein in their entirety.

BACKGROUND OF THE INVENTION

1. Field of the Invention

The present invention relates to a probing device, and more particularly, to an active probe card capable of improving the testing bandwidth of a device under test (DUT).

2. Description of the Prior Art

Generally, after wafer fabrication is completed, a wafer will go through a testing flow to determine whether the semiconductor device is able to operate normally. In the testing flow, a probe card, a prober, and a tester work together to test electrical characteristics of chips on the wafer. The probe card includes a printed circuit board (PCB) mounted with several fine needles, which serves as a testing interface between the prober and the semiconductor device under test. The prober is responsible for precisely moving a piece of wafer to a right position where the probe needles of the probe card are able to probe and contact the corresponding pads in a chip. The tester is responsible for sending out testing signals via the probe card to test or measure the parameters, functionalities, and electrical characteristics of the semiconductor device.

With the advancement of wafer-level packages, high frequency circuits, and three-dimensional integrated circuits (3D IC), high speed or radio frequency (RF) testing is needed for wafer probing or chip probing (CP). For a high speed circuit test, however, the probe needles are equivalent to parasitic inductance. In addition, the high speed testing signals need to go through a relatively long trace from the probe card PCB to the semiconductor device under test. As the high speed testing signals reach the semiconductor device under test, the signals may have already degraded significantly.

Moreover, many semiconductor devices are designed for low power operations in order to meet the demand for energy-efficient electronic products. Nevertheless, such semiconductor devices usually have less driving capability so that signals sent out from the semiconductor device under test will be full of jitter noise after passing through the probe needles and the probe card PCB. In this situation, the tester may not be able to obtain accurate testing results. Consequently, the testing bandwidth is narrowed.

Therefore, it is a challenging task to improve the testing bandwidth of the semiconductor device under test so as to overcome the issues of high speed circuit testing as mentioned above.

SUMMARY OF THE INVENTION

An objective of the present invention is to provide an active probe card capable of improving the testing bandwidth of a device under test. The active probe card includes an active circuit to accelerate the testing flow and improve the testing accuracy such that the probe card is suitable for high speed or RF testing.

An embodiment of the present invention discloses an active probe card for improving testing bandwidth of a device under test (DUT). The active probe card includes a printed circuit board; at least one probe needle, affixed to a first surface of the printed circuit board for probing the DUT; at least one connection member, electrically connected to the at least one probe needle; and an amplification circuit, formed on the printed circuit board and coupled to the at least one connection member for amplifying an input or output signal of the DUT.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 shows an active probe card and a DUT in a testing system according an embodiment of the present invention.

FIG. 3 shows an active probe card and a DUT in a testing system according another embodiment of the present invention.

FIG. 4 shows an active probe card and a DUT in a testing system according a further embodiment of the present invention.

DETAILED DESCRIPTION

Figure 1:
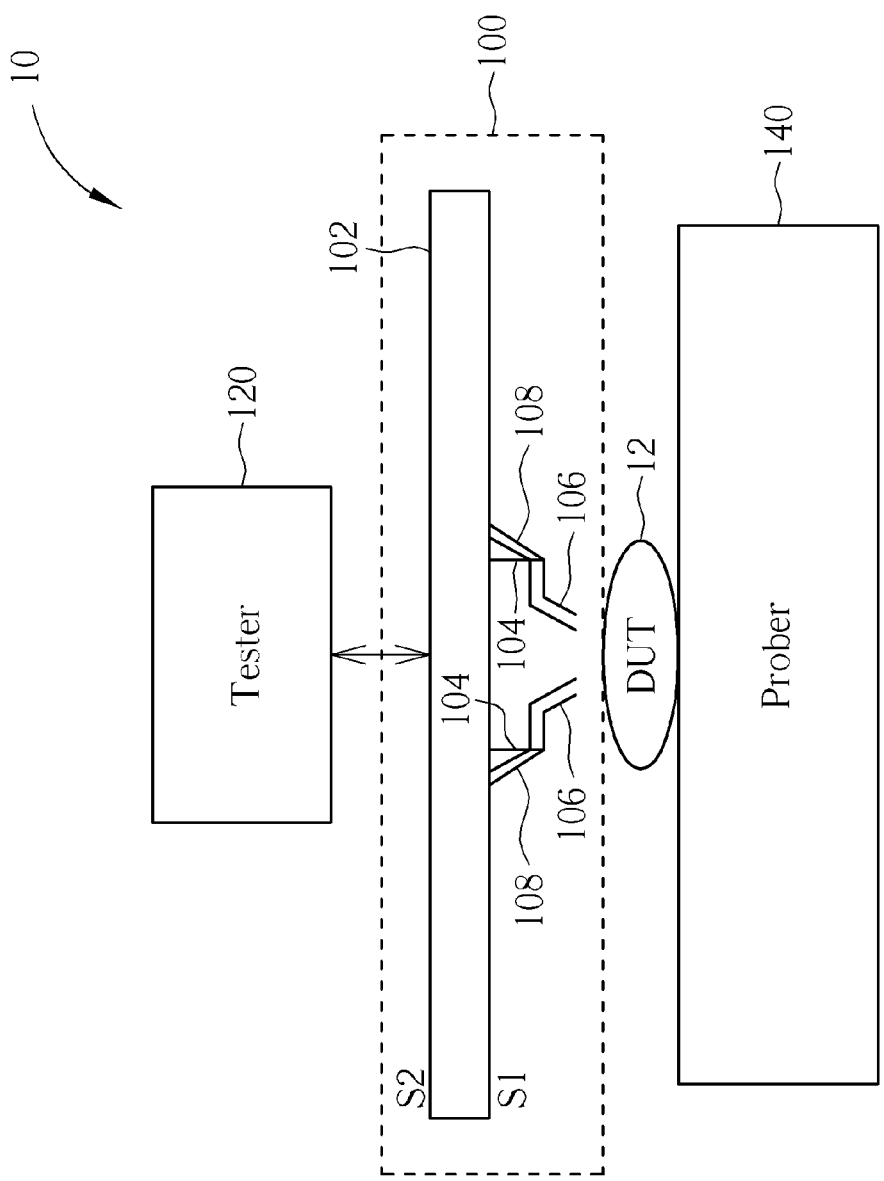
FIG. 1 is a schematic diagram of a testing system according to an embodiment of the present invention.

FIG. 1 is a schematic diagram of a testing system 10 according to an embodiment of the present invention. The testing system 10 includes an active probe card 100, a tester 120, and a prober 140 for testing functionalities, parameters, and electrical characteristics of a device under test (DUT) 12 such as a wafer. The DUT 12 may be tested by wafer probing or chip probing (CP). The active probe device 100 is capable of improving the testing bandwidth of the DUT 12. The active probe device 100 includes a printed circuit board (PCB) 102, at least one affixing unit 104, at least one probe needle 106, and at least one connection member 108. The PCB 102 has two surfaces. The first surface S1 faces the DUT 12, and the second surface S2 faces the tester 120. The connection members 108 electrically connect the probe needles 106. The affixing units 104 are used to affix the probe needles 106 to the first surface S1 of the PCB 102. An amplification circuit (not shown in FIG. 1) formed on the PCB 102 is coupled to the connection members 108 for amplifying an input signal or an output signal of the DUT 12. After the high speed testing signals generated from the tester 120 pass through the amplification circuit on the active probe card 100, the voltage or current of the signals are amplified so that the input signals transmitted to the DUT 12 have larger driving capability. On the other hand, the output signals sent out from the DUT 12 have improved current signal noise ratio (SNR) after passing through the amplification circuit on the active probe card 100. As a result, the impact of noise interference on the testing results is decreased. The testing system 10 therefore has broader testing bandwidth and better testing accuracy, and also has the advantage of faster testing speed.

The amplification circuit is formed on the PCB 102 of the active probe card 100 near the probe needles 106. To obtain preferable testing results, the distance between an output terminal or an input terminal of the amplification circuit and the probe needle 106 to which the amplification circuit is connected is substantially shorter than 10 cm.

FIG. 2 shows an active probe card 200 and a DUT 12 in a testing system according an embodiment of the present invention. The active probe card 200 may be used to realize the active probe card 100 in the testing system 10 shown in FIG. 1. In the active probe card 200, an amplification circuit 20 is formed on the first surface S1 of the PCB 202 near the place where a probe needle 106 is affixed. Since both the amplification circuit 20 and the probe needles 106 are on the first surface S1 of the PCB 202, the connection members 108 may directly connect the probe needles 106 with the output terminal or the input terminal of the amplification circuit 20.

In some examples, the amplification circuit and the probe needles may be set up on difference sides of the PCB. FIG. 3 shows an active probe card 300 and a DUT 12 in a testing system according another embodiment of the present invention. The active probe card 300 may be used to realize the active probe card 100 of the testing system 10. In the active probe card 300, an amplification circuit 30 is formed on the second surface S2 of the PCB 302, approximately above the probe needle 106. The PCB 302 is manufactured with some Vias 312A and 312B. The connection members 108A and 108B are connected to the Vias 312A and 312B at the first surface S1 of the PCB 302. The amplification circuit 30 is electrically connected to the Vias 312A and 312B at the second surface S2 of the PCB 302.

In another example, the Vias may be replaced by a coaxial cable for better electrical characteristics in high frequency band. FIG. 4 shows an active probe card 400 and a DUT 12 in a testing system according a further embodiment of the present invention. The active probe card 400 may be used to realize the active probe card 100 of the testing system 10. In the active probe card 400, an amplification circuit 40 is formed on the second surface S2 of the PCB 402, approximately above the probe needle 106. The PCB 402 has a through-hole 412. The connection member 108 may be a coaxial cable, passing through the through-hole, where one end of the coaxial cable is connected to a probe needle 106, and the other end is connected to the amplification circuit 40.

Note that the present invention forms an amplification circuit on the PCB of the probe card for amplifying the voltage or current of the testing signals, and the testing bandwidth of the DUT is therefore improved. Those skilled in the art may make alterations and/or modifications accordingly. For example, the present invention may be applied to any type of probe card, such as a cantilever probe card, a membrane probe card, a spring probe card, and a Micro Electro Mechanical Systems (MEMS) probe card, to improve the testing bandwidth of the DUT. Moreover, the material used to make the affixing unit for affixing the probe needles to the PCB of the active probe card may be a ceramic material, an electrically insulating plastic material, or any other material that does not affect the electrical characteristics of the probe needles.

Figure 5:
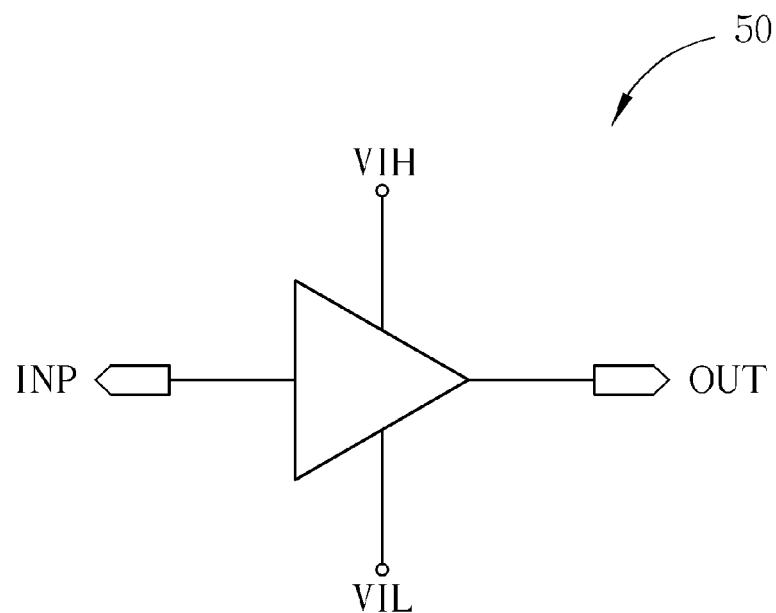
FIG. 5 is a schematic diagram of an amplification circuit according to an embodiment of the present invention.

The amplification circuit is used to amplify the voltage or current of the testing signals. Therefore, any circuit having voltage or current amplification capability may be used to apply to the active probe card if appropriately designed. For example, the amplification circuit 50 shown in FIG. 5 may be used to implement the abovementioned examples (i.e. the amplification circuit 20, 30, or 40). The amplification circuit 50 is a driver integrated circuit (IC). It includes an input terminal INP and an output terminal OUT. The amplification circuit 50 may amplify the input signals of the DUT 12 and/or the output signals of the DUT 12. More specifically, the amplification circuit 50 may be included in an active probe circuit (100, 200, 300, or 400). If there is a need to amplify the input signals of the DUT 12, the input terminal INP of the amplification circuit 50 may be coupled with a test signal output terminal of the tester 120, and the output terminal OUT of the amplification circuit 50 may be coupled with a connection member 108 such that the voltage or current of the testing signals sent to the DUT is amplified and thus increases the driving capability of the input signals sent to the DUT 12. On the other hand, if there is a need to amplify the output signals of the DUT 12, the output terminal OUT of the amplification circuit 50 may be coupled with a test signal input terminal of the tester 120, and the input terminal INT of the amplification circuit 50 may be coupled with another connection member 108. The output signals sent from the DUT 12 are probed by another probe needle 106, and then go through another connection member 108 to the amplification circuit 50 to be amplified in voltage or current. In this way, the current SNR is improved, and the impact of noise interference on the testing results is reduced. In some examples, the active probe card (100, 200, 300, or 400) may include more than one amplification circuit 50, and its connections with the connection members 108 and the tester 120 may be modified appropriately according to testing requirements.

Figure 6:
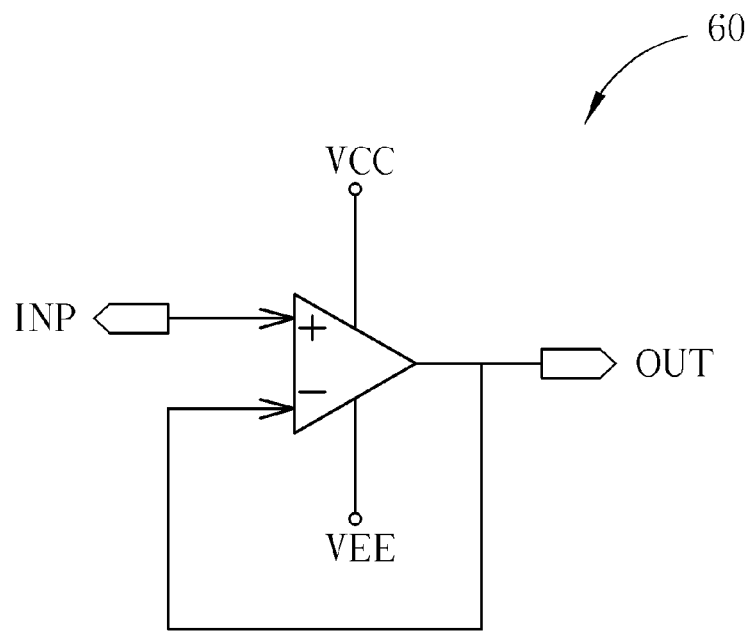
FIG. 6 is a schematic diagram of an amplification circuit according to an embodiment of the present invention.

FIG. 6 shows an amplification circuit 60 according to another embodiment of the present invention. The amplification circuit 60 may be used to implement the abovementioned examples (i.e. the amplification circuit 20, 30, or 40). It includes a single-ended operational amplifier that amplifies the voltage or current of the input signals and/or the output signals of the DUT 12 and works as a buffer. Similar to the amplification circuit 50 shown in FIG. 5, the amplification circuit 60 includes an input terminal INP and an output terminal OUT. Further, the amplification circuit 60 may be included in an active probe circuit (100, 200, 300, or 400). If there is a need to amplify the input signals of the DUT 12, the input terminal INP of the amplification circuit 60 may be coupled with a test signal output terminal of the tester 120, and the output terminal OUT of the amplification circuit 60 may be coupled with a connection member 108 such that the voltage or current of the testing signals sent to the DUT is amplified and thus increases the driving capability of the input signals sent to the DUT 12. On the other hand, if there is a need to amplify the output signals of the DUT 12, the output terminal OUT of the amplification circuit 60 may be coupled with a test signal input terminal of the tester 120, and the input terminal INT of the amplification circuit 60 may be coupled with another connection member 108. The output signals sent from the DUT 12 are probed by another probe needle 106, and then go through another connection member 108 to the amplification circuit 60 to be amplified in voltage or current. In this way, the current SNR is improved, and the impact of noise interference on the testing results is reduced. In some examples, the active probe card (100, 200, 300, or 400) may include more than one amplification circuit 60, and its connections with the connection members 108 and the tester 120 may be modified appropriately according to testing requirements.

Figure 7:
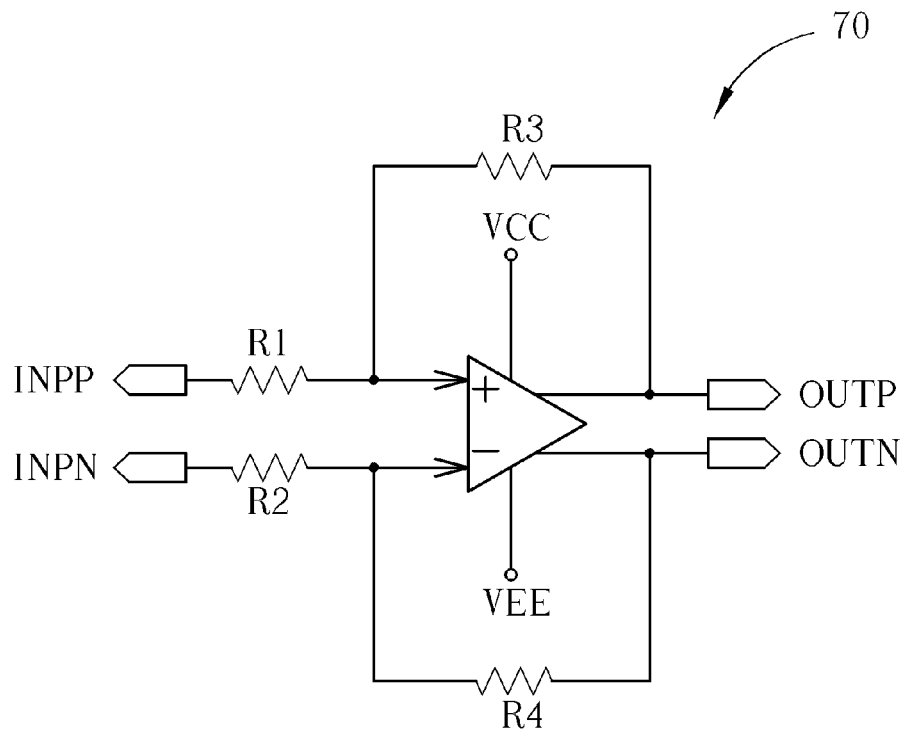
FIG. 7 is a schematic diagram of an amplification circuit according to an embodiment of the present invention.

The active probe card 100 (or 200, 300, 400) may include differential input and output terminals for measuring differential signals. FIG. 7 shows an amplification circuit 70 according to another embodiment of the present invention. The amplification circuit 70 may be used to implement the abovementioned examples (i.e. the amplification circuit 20, 30, or 40). It includes a differential operational amplifier, which may be used for some cases when the DUT 12 requires differential input signals or sends out differential output signal. The amplification circuit 70 includes input terminals INPP and INPN and output terminals OUTP and OUTN. Further, the amplification circuit 70 may be included in an active probe circuit (100, 200, 300, or 400). If there is a need to amplify the input signals of the DUT 12, the input terminals INPP and INPN of the amplification circuit 70 may be coupled with differential test signal output terminals of the tester 120, respectively, and the output terminals OUTP and OUTN of the amplification circuit 70 may be coupled with two connection members 108 transmitting differential signals to connect with two probe needles 106, respectively, such that the voltage or current of the testing signals sent to the DUT is amplified. On the other hand, if there is a need to amplify the output signals of the DUT 12, the output terminals OUTP and OUTN of the amplification circuit 70 may be coupled with differential test signal input terminals of the tester 120, and the input terminals INPP and INPN of the amplification circuit 70 may be coupled with another two connection members 108 which connect with two probe needles 106 for probing the differential output signals of the DUT 12, respectively. In this way, the current SNR is improved, and the impact of noise interference on the testing results is reduced. In some examples, the active probe card (100, 200, 300, or 400) may include more than one amplification circuit 70, and its connections with the connection members 108 and the tester 120 may be modified appropriately according to testing requirements.

Figure 8:
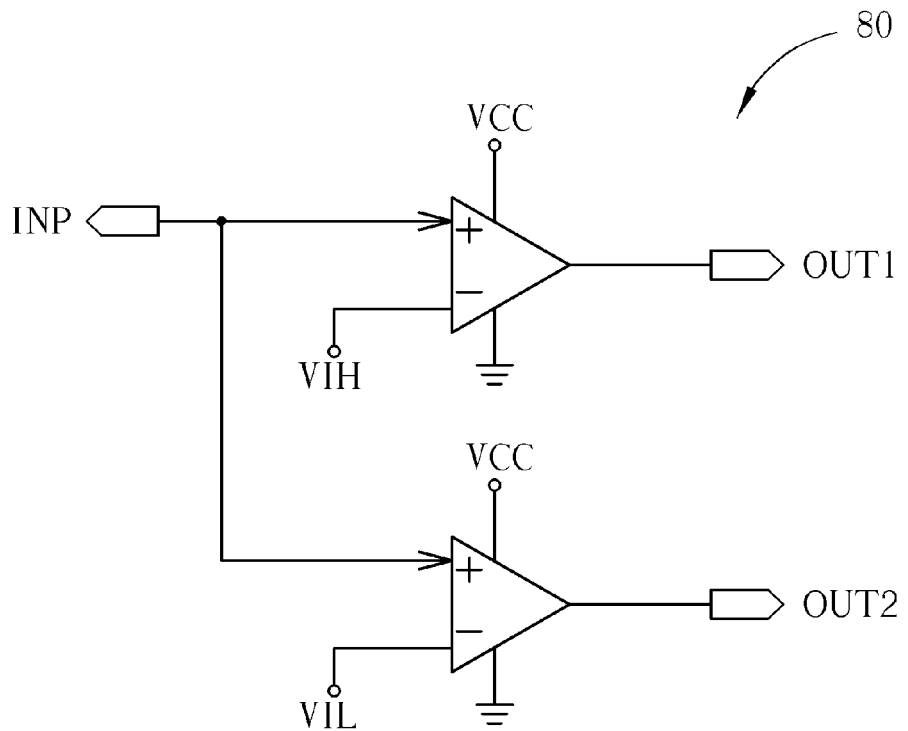
FIG. 8 is a schematic diagram of an amplification circuit according to an embodiment of the present invention.
Figure 9:
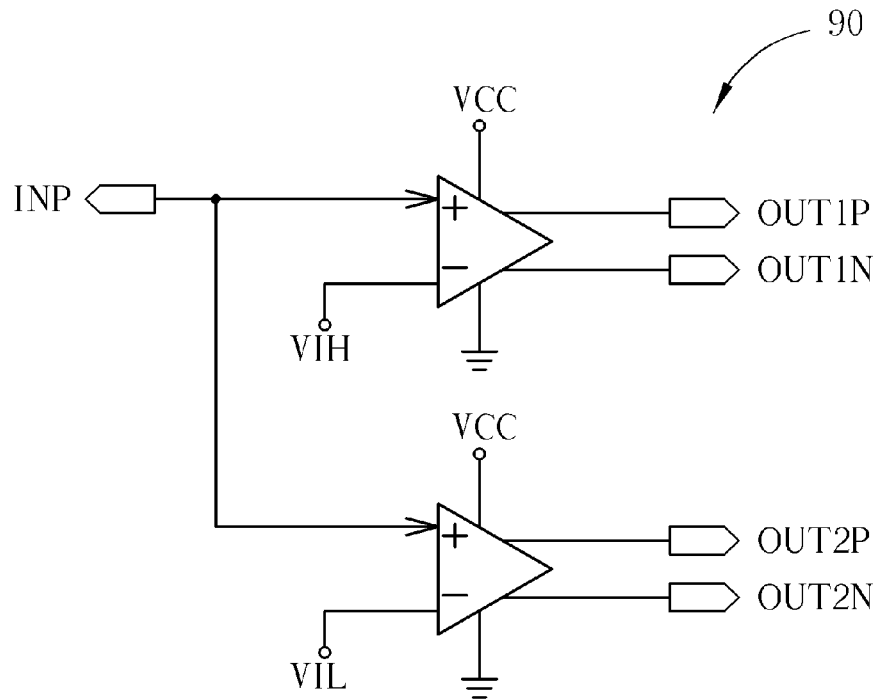
FIG. 9 is a schematic diagram of an amplification circuit according to an embodiment of the present invention.
Figure 10:
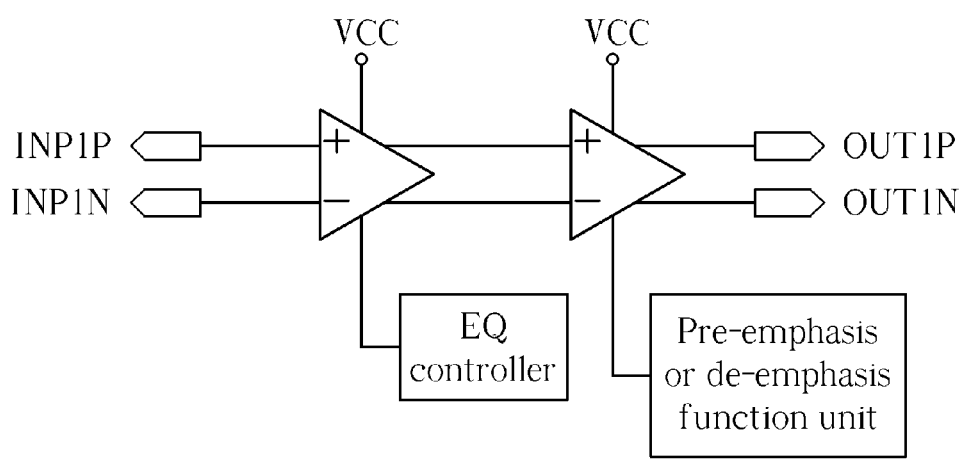
FIG. 10 is a schematic diagram of an amplification circuit according to an embodiment of the present invention.

FIG. 8, FIG. 9, and FIG. 10 respectively illustrate amplification circuits 80, 90, and 11 according to embodiments of the present invention. The amplification circuit 80 may be used to implement the abovementioned examples (i.e. the amplification circuit 20, 30, or 40). It includes a single-ended comparator with an input terminal INP and output terminals OUT1 and OUT2. The amplification circuit 90 may be used to implement the abovementioned examples (i.e. the amplification circuit 20, 30, or 40). It includes a differential comparator with an input terminal INP and output terminals OUT1P, OUT1N, OUT2P and OUT2N. The amplification circuit 11 may be used to implement the abovementioned examples (i.e. the amplification circuit 20, 30, or 40). It includes an equalizer with input terminals INP1P and INP1N and output terminals OUT1P and OUT1N. The equalizer has a programmable or fixed pre-emphasis function and/or de-emphasis function. The low frequency components and the high frequency components of the testing signals usually attenuate in different levels after passing through a probe card and probe needle. In general, the high frequency components attenuate more than the low frequency components. Under this condition, the amplification circuit 11 including an equalizer may be used to amplify the high frequency components in the testing signals with larger amplification factor (i.e. using the pre-emphasis function of the equalizer), and amplify the low frequency components in the testing signals with smaller amplification factor (i.e. using the de-emphasis function of the equalizer). As a result, the high frequency components and the low frequency components in the testing signals can have substantially equal amplitude. The amplification factors of the equalizer may be designed to be programmable or fixed values according to testing requirement. Connections of input terminals and output terminals of the amplification circuits 80, 90, and 11 may be similar to the connections of the aforementioned amplification circuits 50, 60, and 70. Those skilled in the art are able to derive appropriate connection methods for the amplification circuits 80, 90, and 11 by referring to the above descriptions.

In addition, the abovementioned amplification circuits 50, 60, 70, 80, 90, and 11 may be selectively combined together to set in an active probe card according to testing requirement. For instance, the amplification circuit 50 may be used to amplify the input signals of the DUT 12, while the amplification circuit 60 is used to amplify the output signals of the DUT 12.

To sum up, the present invention provides an active probe card with an amplification circuit coupled to probe needles. The amplification circuit is in proximity to the probe needles. It may include a driver IC, a differential operational amplifier, a single-ended operational amplifier, a differential comparator, a single-ended comparator, or an equalizer for enhancing the driving capability of the input signals and/or output signals of the DUT. As a result, the active probe card of the present invention may diminish the noise interference to the testing results, and improve the testing bandwidth, testing accuracy, and testing speed for the DUT, which is beneficial for high-speed circuit testing.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An active probe card for improving testing bandwidth of a device under test (DUT), comprising:
    a printed circuit board;
    at least one probe needle, affixed to a first surface of the printed circuit board for probing the DUT;
    at least one connection member, electrically connected to the at least one probe needle;
    an amplification circuit, formed on the printed circuit board and coupled to the at least one connection member for amplifying an input signal of the DUT; and
    at least one affixing unit, for affixing the at least one probe needle to the first surface of the printed circuit board, wherein a material of the affixing unit is a ceramic material or an electrically insulating plastic material;
    wherein the amplification circuit comprises:
        a differential operational amplifier or a single-ended operational amplifier; or a differential comparator or a single-ended comparator; or an equalizer;
    wherein the equalizer has at least one of a pre-emphasis function and a de-emphasis function, the pre-emphasis function provides a first amplification factor, the de-emphasis function provides a second amplification factor, the first amplification factor is greater than the second amplification factor, and the first amplification factor and the second amplification factor are programmable or fixed values.

2. The active probe card of claim 1, wherein the amplification circuit is a driver integrated circuit (IC).

3. The active probe card of claim 1, wherein the amplification circuit is formed on a second surface of the printed circuit board, where the second surface is the top layer of the printed circuit board, and the first surface is the bottom layer of the printed circuit board.

4. The active probe card of claim 3, wherein the printed circuit board has at least one via, each of the at least one connection member is paired with one of the at least one via to electrically connect with each other at the first surface of the printed circuit board, and the amplification circuit is electrically connected to the at least one via at the second surface of the printed circuit board.

5. The active probe card of claim 3, wherein the printed circuit board has a through-hole, the at least one connection member is a coaxial cable, passing through the through-hole, where one end of the coaxial cable is connected to the at least one probe needle, and the other end is connected to the amplification circuit.

6. The active probe card of claim 1, wherein a distance between an output terminal or an input terminal of the amplification circuit and the at least one probe needle is substantially shorter than 10 cm.

\* \* \* \* \*